July 5, 1960 L. B. M. BUCHANAN 2,943,452

THERMOELECTRIC WARMING AND COOLING APPLIANCE

Filed May 14, 1959 2 Sheets-Sheet 1

INVENTOR
LESLIE B. M. BUCHANAN
BY William J. Foley
ATTORNEY

THERMOELECTRIC WARMING AND COOLING APPLIANCE

INVENTOR
LESLIE B. M. BUCHANAN
BY William J. Foley
ATTORNEY

United States Patent Office 2,943,452

Patented July 5, 1960

2,943,452

THERMOELECTRIC WARMING AND COOLING APPLIANCE

Leslie B. M. Buchanan, Galloway, Ohio, assignor to Westinghouse Electric Corporation, East Pittsburgh, Pa., a corporation of Pennsylvania Filed May 14, 1959, Ser. No. 813,187

4 Claims. (Cl. 62—3)

This invention relates to warming and cooling appliances and particularly to transportable devices for maintaining foodstuffs at palatable serving temperatures.

This invention is applicable to and constitutes an improvement on the serving cart described in an abandoned application of Royal S. Buchanan, Serial No. 813,220, filed May 14, 1959, entitled, "Applaince," and assigned to the same assignee as this invention.

The serving cart described in the above-mentioned application is a wheeled appliance having an insulated cooling compartment, an insulated warming compartment and a thermoelectric heat pump for removing heat from the cooling compartment and transferring this heat to the warming compartment. The present invention is concerned particularly with the apparatus, including the thermoelectric heat pump, by which heat is pumped from one compartment to another. This invention takes into consideration the fact that present day thermoelectric heat systems operate at comparatively low coefficients of performance, of the order of 0.2 or lower, and as a result, the heat which must be dissipated from the hot side, or face, of the thermoelectric array is considerably in excess of the heat absorbed by the cold side of the array. To a certain extent, this is advantageous in thermoelectric applications for combined heating and cooling appliances because more heat is generally required to maintain the warming compartment at an elevated temperature than must be removed from the cooling compartment to maintain it at a depressed temperature. In most instances, however, the heat which must be dissipated from the hot side of the thermoelectric array is in excess of the requirements of the warm compartment.

This invention provides a novel arrangement, or system, for disposing of the excess heat generated by the thermoelectric heat pump and further provides regulation of the rate at which this heat is removed, so as to maintain the desired temperatures in both the cooling compartment and the warming compartment regardless of changes in ambient temperature.

In accordance with this invention, a heat conducting structure disposed between the hot side of the thermoelectric array and the warming compartment is provided with an extended surface area in thermal transfer relationship with ambient air, and provision is made for circulating ambient air over this surface for the purpose of dissipating heat flowing into said structure which is in excess of that required to maintain a desired temperature in the warming compartment. It is further contemplated that means be provided for increasing or decreasing the quantity of air flowing over the above-mentioned heat transfer surface in response, respectively, to an increase or a decrease of the temperature in the warming compartment.

In the preferred embodiment of the invention, a blower is utilized for forcibly circulating ambient air through a plurality of pasages in the heat conducting structure between the hot side of the thermoelectric array and a heat dissipating plate within the warming compartment.

Operation of the blower is controlled by a thermostatic switch responsive to temperature changes of the heat dissipating plate.

The objects, advantages and additional features of the invention will be apparent from a reading of the detailed description of the invention which follows, and in which reference is made to the accompanying drawings, forming a part hereof, and wherein.

Figure 1:
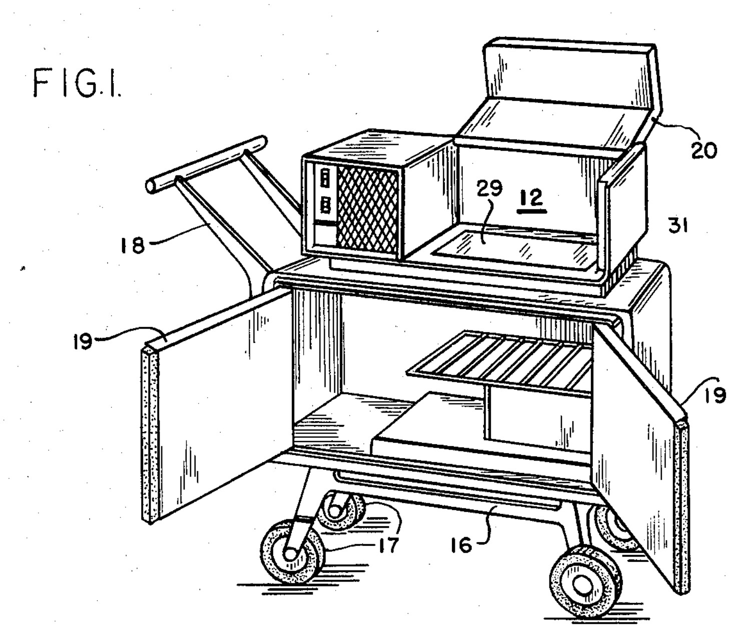
Fig. 1 is a perspective view of a serving cart embodying this invention.

The serving cart shown in Fig. 1 is illustrative of combined warming and cooling appliances to which the present invention is applicable. The cart includes a cooling compartment 11 and a warming compartment 12, which are surrounded by heat insulated wall structures, indicated at 13 and 14, respectively. The cart includes a frame 16 having wheels 17 thereon which permit the cart to be moved about by a handle 18. Access to the interior of cooling compartment 11 is permitted by a pair of hingeably mounted doors 19, and access to the warming compartment 12 is permitted by a hinged closure 20.

This cart is intended to be used in hotels, restaurants and private residences for transporting food from a preparation area to a remote area in which it is to be consumed. Cooling compartment 11 is maintained at a suitable temperature below ambient air temperature, of the order of 45° F., for storing chilled items, such as desserts, salads and beverages, at a palatable serving temperature. Warming compartment 12 is maintained at a suitable temperature above ambient air temperature, of the order of 130° F. to 150° F., for the purpose of maintaining foodstuffs which are served in heated condition.

The serving cart utilizes a thermoelectric heat pump 21 (see Figs. 2 and 3) for removing heat from the cooling compartment 11 and adding heat to the warming compartment 12. This heat pump 21 comprises an array of thermoelectric elements 22 formed of two materials having dissimilar thermomotive properties. The different materials are distinguished in Fig. 3 by the letters N and P, which designate that the thermoelectric elements 22 have either negative or positive thermomotive properties. The thermoelectric elements 22 may be made from several materials currently available; antimony being representative of a P type material and bismuth being representative of an N type material. The several thermoelectric elements 22 are serially connected as shown in Fig. 3 by means of junction straps 23 and 24 formed of material, such as copper, having good electrical and heat conducting properties. The thermoelectric elements 22 and the junction straps 23 and 24 form an array which, according to the Peltier principle, is capable of absorbing heat at the junctions formed by straps 23 and of dissipating heat at the junctions formed by straps 24 when direct electrical current is passed through the array from plus to minus as shown in Fig. 3. In other words, electric current flowing from an N element to a P element causes heat to be absorbed at their junction, and current flowing from a P element to an N element causes heat to be generated at their junction.

The heat pumping system includes a heat absorbing structure in cooling compartment 11 in the form of a plate 26 of good heat conducting material, such as aluminum, which is in heat transfer relationship with cold junction straps 23 of the thermoelectric array. Heat generated at the hot junctions of the array is conducted through junction straps 24 to another heat conducting plate 27. The facing surfaces of the plates 26 and 27 are preferably coated or otherwise provided with a film or cover of electrical insulating material 30 to prevent these plates from shorting the electrical circuit through the thermoelectric array.

The plate 27, which is in heat transfer relationship with the hot junctions of the thermoelectric heat pump 21, forms a part of a heat conducting structure, indicated generally by the reference numeral 28, for conducting heat from the heat pump into warming compartment 12. This heat conducting structure also includes a heat dissipating plate 29 of metal or other good heat conducting material disposed in the bottom of warming compartment 12 and a plurality of vertically disposed partitions 31, which are also formed of metal or other good heat conducting material. The partitions 31 are preferably joined to plates 27 and 29, as by soldering or brazing, to reduce the resistance to heat flow through structure 28. As can be seen from Figs. 2 and 3 of the drawings, the partitions 31 are spaced apart to provide a plurality of parallel, horizontal air passages 32 through heat conducting structure 28.

The function of passages 32 is to permit ambient air to be circulated through the heat conducting structure 28 and in contact with the extended surface area provided by partitions 31 for the purpose of removing heat flowing through structure 28 which is in excess of the heat required to maintain warming compartment 12 at the desired temperature.

Circulation of ambient air is preferably effected by means of a motor driven blower 33 under control of a thermostatic switch 34 having a temperature sensing element 36 in contact with plate 29, which is located in warming compartment 12. The thermostatic switch 34 is adapted to close an electrical circuit to blower 33 to energize the blower when the temperature of plate 29 rises above a predetermined value, and to open the circuit to deenergize blower 33 when the temperature of plate 29 drops below a predetermined value. (See Fig. 3.) Thermostatic switches for performing this function are well known in the art and a detailed description thereof is deemed to be unnecessary.

Figure 2:
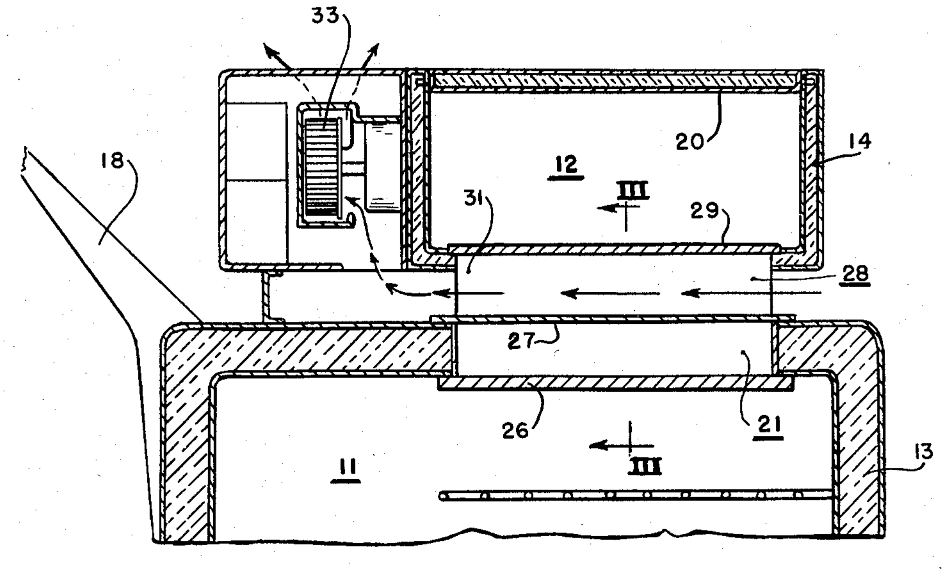
Fig. 2 is a fragmentary, vertical sectional view of the upper portion of the cart shown in Fig. 1.
Figure 3:
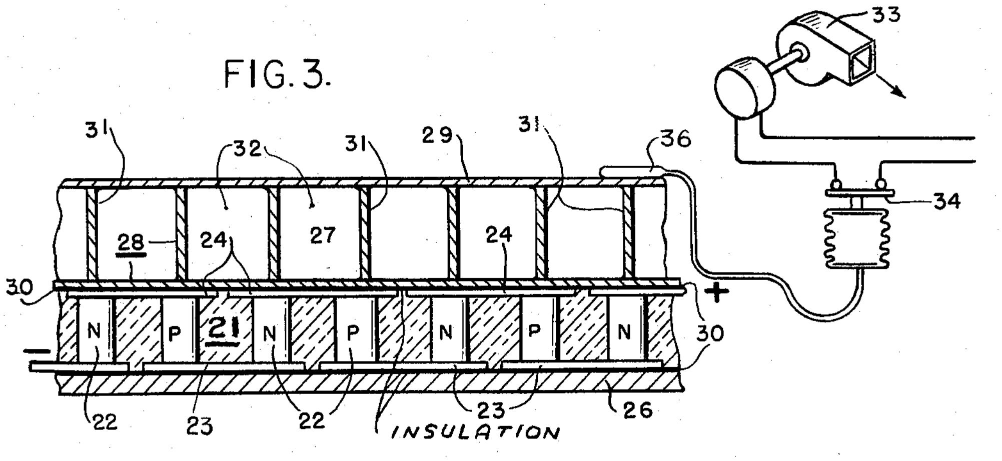
Fig. 3 is an enlarged fragmentary sectional view of the thermoelectric heat pump, which view is taken generally as indicated by the line III—III in Fig. 2.

In operation of the serving cart illustrated in Figs. 1 to 3, energization of the heat pump 21 results in heat being extracted from cooling compartment 11 and pumped into warming compartment 12. A greater quantity of heat generally must be pumped into the warming compartment in order to maintain the desired temperature therein than must be extracted from the cooling compartment 11 in order to maintain the desired temperature in that compartment. This is due to two factors. The temperature differential between the warmer compartment and ambient air is generally greater than the temperature differential between ambient air and the temperature of the cooling compartment. Also, the cooling compartment is generally better insulated to reduce the heat leakage into this compartment in order to reduce the size of the heat pump to a minimum. Nevertheless, the heat available from the hot junctions of the thermoelectric array is often in excess of the heat requirements of the warming compartment 12. This is due to the relatively low coefficient of performance, i.e., ratio of heat absorbed at the cold junctions to total equivalent heat input to the heat pump, of present day thermoelectric pumps, which is attributable in part to heat generation as the result of resistance losses in the thermoelectric elements 22 of the heat pump. A typical serving cart operating in ambient air at 80° F. might, for example, possess the following heat flow relationships: Heat flow into cooling compartment 11—50 B.t.u.'s per hour; heat lost from warming compartment 12—75 B.t.u.'s per hour; electrical input to heat pump 28 (assuming a coefficient of performance of 0.2), equivalent to 250 B.t.u.'s per hour.

Under this set of conditions, 225 B.t.u.'s per hour must be disposed of by the heat pump 21 without passing through warming compartment 12. As can be readily understood, the capacity of blower 33 and the surface area of partitions 31 and plates 27 and 29 can be designed to dissipate this quantity of heat by circulating ambient air through passages 32. Actually the system dissipating heat to ambient air should be capable of handling the excess heat from the heat pump in the highest ambient temperature condition for which the cart is designed.

In order to prevent too large a quantity of heat from being removed through the circulation of ambient air under low ambient temperature conditions, with the resultant lowering of the temperatures in the compartments 11 and 12, the thermostatic switch 34 deenergizes the blower 33 when it senses an undesirable reduction in the temperature of heat dissipating plate 29 in warming compartment 12. Should the temperature in compartment 12 thereafter rise, the thermostatic switch 34 will again energize blower 33, to prevent the temperature in compartment 12 from reaching an undesirably high value and to insure efficient operation of the thermoelectric heat pump by limiting the temperature of the hot side of the pump.

Figure 4:
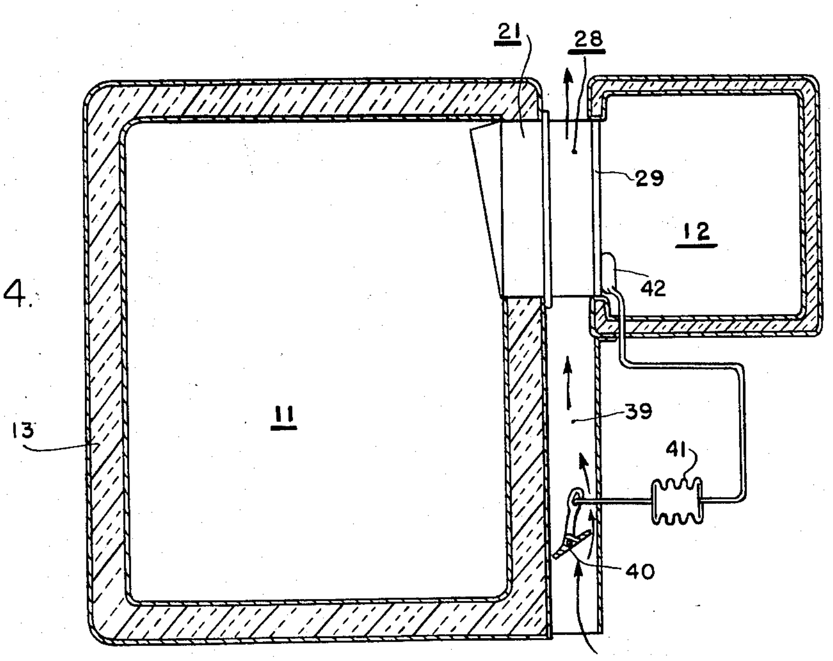
Fig. 4 is a sectional view of another warming and cooling appliance embodying a modification of the invention.

Illustrated in Fig. 4 is another combined cooling and warming appliance embodying a modification of this invention. Although not intended to be portable, this appliance includes an insulated cooling compartment 11, an insulated warming compartment 12 and a thermoelectric heat pump 21 for pumping heat from compartment 11 into compartment 12. Interposed between the heat pump 21 and warming compartment 12 is a heat conducting structure 28 similar to that embodied in the previously described embodiment and having a plurality of air passages therein and extended surface areas in contact with ambient air.

Unlike the preceding embodiment, the air passages in heat conducting structure 28 are arranged vertically, so that air flow thereover is promoted by a chimney effect induced in a duct 39, formed to one side of a vertical wall of cooling compartment 11. This arrangement eliminates the need for a motor driven blower for circulating ambient air through heat conducting structure 28.

In accordance with the invention, means are provided for controlling the flow of air through structure 28 in response to temperature conditions in warming compartment 12. As shown in Fig. 4, this means includes a damper 40 pivotally mounted in ambient air duct 39 for movement to a number of different positions to regulate the flow of air through the duct. Damper 40 is positioned through a mechanical linkage by a thermostatic bellows 41 which is connected to a temperature sensing bulb 42. The bulb is in contact with the heat dissipating plate 29 forming a part of heat conducting structure 28 and located in warming compartment 12. The thermostatic bellows 41 is arranged to move damper 40 to a position to restrict, or close off, the flow of air through heat conducting structure 28 when bulb 42 senses an undesirable lowering of the temperature of plate 29 and, conversely, to move damper 40 to a position to permit increased air flow when bulb 42 senses a rise in temperature of plate 29. By this arrangement, the temperatures in the two compartments 11 and 12 of the appliance are maintained at their respective desired temperatures, regardless of changes in ambient air temperature.

While the invention has been shown in two forms, it will be obvious to those skilled in the art that it is not so limited, but is susceptible of various other changes and modifications without departing from the spirit thereof.

What is claimed is:

1. A combined warming and cooling appliance comprising in combination, an insulated cooling compartment adapted to be maintained at a temperature below the temperature of ambinet air, an insulated warming compartment adapted to be maintained at a temperature above the temperature of ambient air, a thermoelectric heat pump for transferring heat from said cooling compartment to said warming compartment, said pump comprising an array of thermoelectric elements formed of dissimilar thermomotive materials and arranged to provide a plurality of cold junctions and a plurality of hot junctions, means for conveying heat from said cooling compartment to said cold junctions, means for conveying heat from said hot junctions to said warming compartment, said last-named means comprising a structure formed of good heat conducting material and having a portion thereof in thermal transfer relationship with said warming compartment, said structure being further provided with an extended heat transfer surface which is isolated from the contents of said compartments, and means for conveying ambient air in thermal transfer relationship with said extended heat transfer surface for removing from said structure heat in excess of that required to maintain said warming compartment at a predetermined temperature.

2. A combined heating and cooling appliance comprising in combination, an insulated cooling compartment adapted to be maintained at a temperature below the temperature of ambient air, an insulated warming compartment adapted to be maintained at a temperature above the temperature of ambient air, heat absorbing structure in said cooling compartment, heat dissipating structure in said warming compartment, a thermoelectric heat pump for transferring heat from said cooling compartment to said warming compartment, said heat pump comprising an array of thermoelectric elements formed of dissimilar thermomotive materials and arranged to provide a plurality of cold junctions and a plurality of hot junctions, said cold junctions being in heat transfer relationship with said heat absorbing structure, heat conducting means in heat transfer relationship with said hot junctions and said heat dissipating structure, said heat conducting means having an extended surface area thereof in contact with ambient air, and means responsive to the temperature of said heat dissipating structure for effecting an increase in the flow of ambient air over said surface area upon an increase in the temperature of said heat dissipating structure and for effecting a reduction in air flow over said surface area upon a decrease in the temperature of said heat dissipating structure.

3. A combined heating and cooling appliance comprising in combination, an insulated cooling compartment adapted to be maintained at a temperature below the temperature of ambient air, an insulated warming compartment adapted to be maintained at a temperature above the temperature of ambient air, heat absorbing structure in said cooling compartment, heat dissipating structure in said warming compartment, a thermoelectric heat pump for transferring heat from said cooling compartment to said warming compartment, said heat pump comprising an array of thermoelectric elements formed of dissimilar thermomotive materials and arranged to provide a plurality of cold junctions and a plurality of hot junctions, said cold junctions being in heat transfer relationship with said heat absorbing structure, heat conducting means in heat transfer relationship with said hot junctions and said heat dissipating structure, said heat conducting means having a plurality of passages therethrough, means for forcibly circulating ambient air through said passages, and thermostatic means controlling said air circulating means for respectively increasing or decreasing the flow of air through said passages in response to an increase or a decrease in the temperature of said heat dissipating structure.

4. A combined warming and cooling appliance comprising in combination, an insulated cooling compartment adapted to be maintained at a temperature below the temperature of ambient air, an insulated warming compartment adapted to be maintained at a temperature above the temperature of ambient air, a thermoelectric heat pump for transferring heat from said cooling compartment to said warming compartment, said pump comprising an array of thermoelectric elements formed of dissimilar thermomotive materials and arranged to provide a plurality of cold junctions and a plurality of hot junctions, means for conveying heat from said cooling compartment to said cold junctions, means for conveying heat from said hot junctions to said warming compartment, said last-named means comprising a structure formed of good heat conducting material and having a portion thereof in thermal transfer relationship with said warming compartment, said structure being further provided with an extended heat transfer surface in thermal transfer relationship with ambient air, a blower for forcibly circulating ambient air over said heat transfer surface, and thermostatic means responsive to the temperature of said portion of said structure for controlling operation of said blower.

References Cited in the file of this patent

UNITED STATES PATENTS

| | | |
|---|---|---|
| 420,641 | Dewey | Feb. 4, 1890 |
| 1,769,119 | Davenport | July 1, 1930 |

FOREIGN PATENTS

| | | |
|---|---|---|
| 829,171 | Germany | Jan. 24, 1952 |